United States Patent
Kim et al.

(10) Patent No.: US 11,963,415 B2
(45) Date of Patent: Apr. 16, 2024

(54) DISPLAY DEVICE INCLUDING A POWER SUPPLY LINE THAT OVERLAPS A DRIVING CIRCUIT

(71) Applicant: SAMSUNG DISPLAY CO., LTD., Yongin-si (KR)

(72) Inventors: Dongwook Kim, Yongin-si (KR); Wonkyu Kwak, Yongin-si (KR); Sunja Kwon, Yongin-si (KR); Seho Kim, Yongin-si (KR); Hansung Bae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/178,501

(22) Filed: Mar. 4, 2023

(65) Prior Publication Data

US 2023/0209942 A1 Jun. 29, 2023

Related U.S. Application Data

(63) Continuation of application No. 17/454,109, filed on Nov. 9, 2021, now abandoned, which is a (Continued)

(30) Foreign Application Priority Data

Jan. 19, 2018 (KR) ........................ 10-2018-0007238

(51) Int. Cl.
*H10K 59/131* (2023.01)
*G09G 3/3208* (2016.01)
(Continued)

(52) U.S. Cl.
CPC ......... *H10K 59/131* (2023.02); *G09G 3/3208* (2013.01); *G09G 3/3233* (2013.01);
(Continued)

(58) Field of Classification Search
CPC ......... G09G 3/2096; G09G 3/30–3291; G09G 2300/0408; G09G 2300/0421;
(Continued)

(56) References Cited

U.S. PATENT DOCUMENTS 7,839,083 B2 11/2010 Kubota
8,432,334 B2 4/2013 Bang et al.
(Continued)

FOREIGN PATENT DOCUMENTS

CN 107527933 A 12/2017
EP 2 178 133 A2 4/2010
(Continued)

OTHER PUBLICATIONS

European Search Report for Application Serial No. 19152453.7-1212 dated Oct. 10, 2019.
(Continued)

*Primary Examiner* — Keith L Crawley
(74) *Attorney, Agent, or Firm* — F. CHAU & ASSOCIATES, LLC

(57) ABSTRACT

A display device includes a substrate. The display unit is disposed on the substrate and includes a pixel circuit and a display element electrically connected to the pixel circuit. A driving circuit is disposed outside of the display unit. The driving circuit includes a thin film transistor. An inorganic insulating layer is disposed on the driving circuit. A power supply line is disposed on the inorganic insulating layer, overlaps the driving circuit, and is connected to a common electrode of the display element. An encapsulation substrate is disposed on the power supply line and faces the substrate. A sealing material is interposed between the substrate and the encapsulation substrate and overlaps the driving circuit.

14 Claims, 9 Drawing Sheets

Related U.S. Application Data continuation of application No. 16/251,917, filed on Jan. 18, 2019, now Pat. No. 11,171,195.

(51) Int. Cl.
| | | |
|---|---|---|
| *G09G 3/3233* | (2016.01) | |
| *G09G 3/3266* | (2016.01) | |
| *G09G 3/3275* | (2016.01) | |
| *H01L 27/12* | (2006.01) | |
| *H05K 1/18* | (2006.01) | |
| *H10K 50/81* | (2023.01) | |
| *H10K 50/82* | (2023.01) | |
| *H10K 50/842* | (2023.01) | |

(52) U.S. Cl.
CPC ......... *G09G 3/3266* (2013.01); *G09G 3/3275* (2013.01); *H01L 27/124* (2013.01); *H05K 1/189* (2013.01); *H10K 50/81* (2023.02); *H10K 50/82* (2023.02); *H10K 50/8426* (2023.02); *H05K 2201/10128* (2013.01)

(58) Field of Classification Search
CPC ... G09G 2300/0426; G09G 2310/0264; G09G 2310/0281; H10K 50/805–844; H10K 59/131; H10K 59/805–873; H05K 1/189; H05K 2201/10128; H01L 27/124
See application file for complete search history.

(56) References Cited

U.S. PATENT DOCUMENTS

| | | | |
|---|---|---|---|
| 9,600,127 | B2 | 3/2017 | Hong |
| 2,017,034 | A1 | 11/2017 | Song et al. |
| 9,887,241 | B2 | 2/2018 | Yamazaki et al. |
| 10,205,118 | B2 | 2/2019 | Kim |
| 11,171,198 | B2 | 11/2021 | Kim et al. |
| 2003/0094615 | A1 | 5/2003 | Yamazaki et al. |
| 2003/0168966 | A1 | 9/2003 | Kobayashi et al. |
| 2011/0043495 | A1 | 2/2011 | Bang et al. |
| 2012/0026074 | A1 | 2/2012 | Lee et al. |
| 2014/0361273 | A1 | 12/2014 | Nozawa |
| 2015/0102295 | A1 | 4/2015 | Hong |
| 2015/0115234 | A1 | 4/2015 | Hong |
| 2015/0221708 | A1 | 8/2015 | Go et al. |
| 2016/0079324 | A1 | 3/2016 | Go et al. |
| 2016/0086977 | A1* | 3/2016 | Go .................. H10K 59/131 257/773 |
| 2016/0118420 | A1 | 4/2016 | Yang et al. |
| 2016/0343792 | A1 | 11/2016 | Jang |
| 2017/0033312 | A1 | 2/2017 | Kim et al. |
| 2017/0236886 | A1 | 8/2017 | Matsueda |
| 2017/0271620 | A1* | 9/2017 | Kato .................. H01L 27/12 |
| 2017/0278912 | A1 | 9/2017 | Kim et al. |
| 2017/0309694 | A1 | 10/2017 | Furuie |
| 2017/0365217 | A1 | 12/2017 | An et al. |
| 2019/0006442 | A1 | 1/2019 | Byun et al. |
| 2019/0229177 | A1 | 7/2019 | Kim et al. |

FOREIGN PATENT DOCUMENTS

| | | |
|---|---|---|
| EP | 2 287 914 | 2/2011 |
| EP | 3 021 364 A1 | 5/2016 |
| EP | 3 255 675 A1 | 12/2017 |
| JP | 4593179 | 9/2010 |
| JP | 2016-119146 | 6/2016 |
| JP | 2017-147092 | 8/2017 |
| KR | 10-2006-0082637 | 7/2006 |
| KR | 10-2011-0019498 | 2/2011 |
| KR | 10-2015-0049141 A | 5/2015 |
| KR | 10-2015-0057441 | 5/2015 |
| KR | 10-2016-0136517 | 11/2016 |
| KR | 10-2017-0015629 | 2/2017 |
| KR | 10-2017-0113763 | 10/2017 |
| KR | 10-2017-0140458 | 12/2017 |
| KR | 10-2018-0002436 | 1/2018 |
| TW | 200906219 | 2/1997 |

OTHER PUBLICATIONS

European Search Report for Application Serial No. 19152453.7-1212 dated Jun. 24, 2019.

* cited by examiner

DISPLAY DEVICE INCLUDING A POWER SUPPLY LINE THAT OVERLAPS A DRIVING CIRCUIT

CROSS-REFERENCE TO RELATED PATENT APPLICATION

This application is a Continuation of co-pending U.S. patent application Ser. No. 17/454,109, filed Nov. 9, 2021, which is a Continuation of U.S. patent application Ser. No. 16/251,917, filed on Jan. 18, 2019, which claims priority to and the benefit of Korean Patent Application No. 10-2018-0007238, filed on Jan. 19, 2018, in the Korean Intellectual Property Office, the disclosures of which are incorporated by reference herein in their entirety.

TECHNICAL FIELD

The present disclosure relates to a display device and, more specifically, to a display device including a power supply line that overlaps a driving circuit.

DISCUSSION OF THE RELATED ART

Organic light-emitting display devices are a type of self-emitting display devices that do not require the use of an additional light source, such as a backlight. Organic light-emitting display devices can be driven with a low voltage and can be lightweight and thin. In addition, organic light-emitting display devices have favorable characteristics such as a wide viewing angle, a high contrast, and a fast response speed, and thus have drawn attention as next-generation display devices.

Various types of display devices, such as organic light-emitting display devices, are used to display images to users. Display devices such as these generally include a display area within which an image is displayed, and a non-display area, i.e. a dead area, in which an image is not displayed. As the non-display area increases the size of the display device without increasing the area in which an image is displayed, modern display devices are being developed to have a smaller non-display area. However, various important components of the display device generally occupy the non-display area, and so reducing the size of the non-display area is technically difficult.

SUMMARY

A display device includes a substrate. A display unit is disposed on the substrate and includes a pixel circuit and a display element electrically connected to the pixel circuit. A driving circuit is disposed outside of the display unit. The driving circuit includes a thin film transistor. An inorganic insulating layer is disposed on the driving circuit. A power supply line is disposed on the inorganic insulating layer, overlaps the driving circuit, and is connected to a common electrode of the display element. An encapsulation substrate is disposed on the power supply line and faces the substrate. A sealing material is interposed between the substrate and the encapsulation substrate and overlaps the driving circuit.

A display device includes a substrate. A display unit is disposed on the substrate and includes a pixel circuit, an organic insulating layer, and a display element. The pixel circuit comprises a scan line, a data line, and a driving voltage line. The organic insulating layer is disposed on the pixel circuit. The display element includes a pixel electrode electrically connected to the pixel circuit via a contact hole of the organic insulating layer, an emission layer on the pixel electrode, and a common electrode on the emission layer. A driving circuit is disposed outside the display unit and includes a thin film transistor. An inorganic insulating layer covers the driving circuit. A power supply line is disposed on the inorganic insulating layer and connects to the common electrode. An end of the power supply line is adjacent to the display unit and is covered by the organic insulating layer. An encapsulation substrate is disposed on the power supply line and faces the substrate. A sealing material is interposed between the substrate and the encapsulation substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
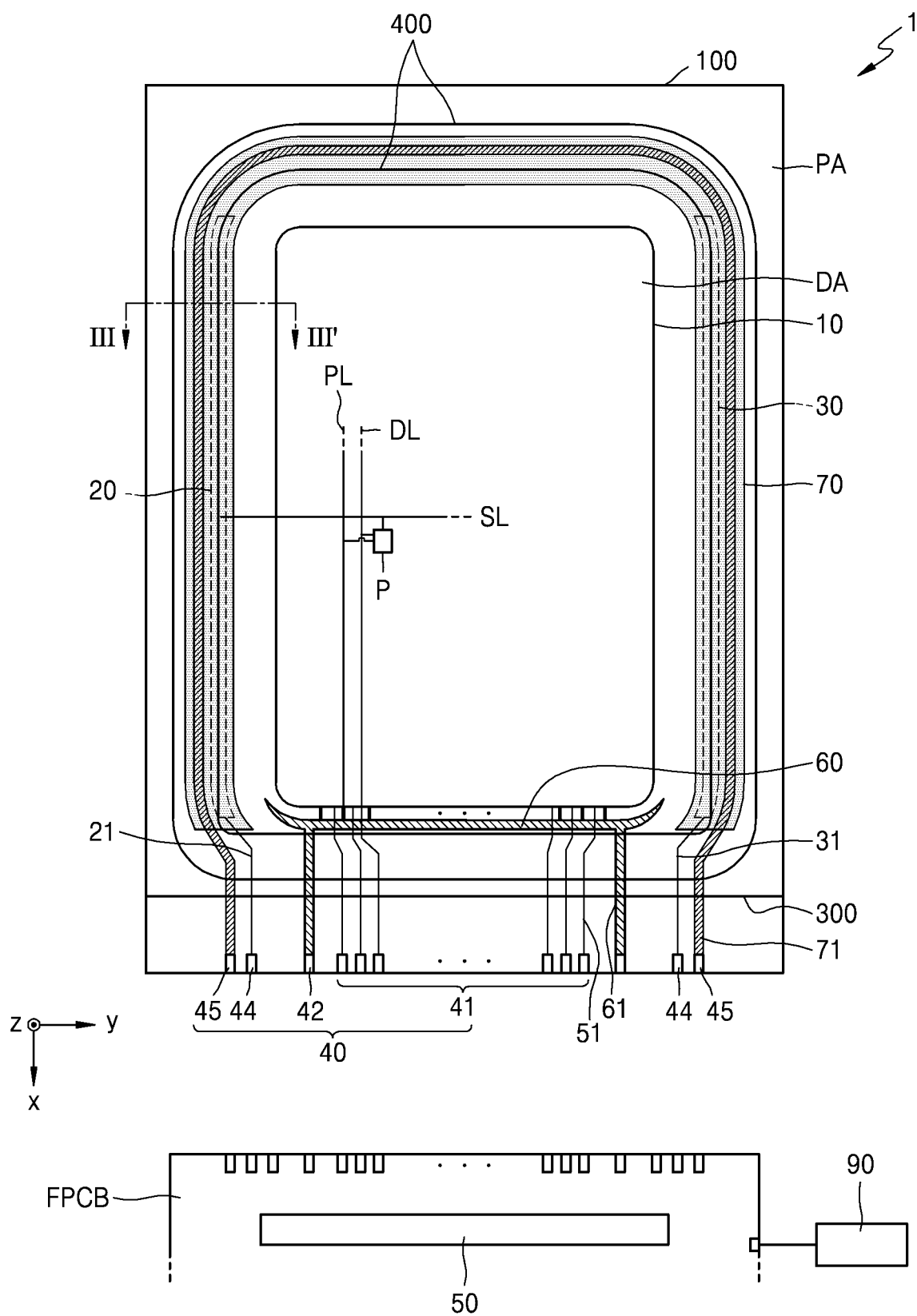
FIG. 1 is a schematic plan view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. In the accompanying drawings and corresponding description, like reference numerals may refer to like elements.

One or more embodiments of the disclosure will be described below in more detail with reference to the accompanying drawings. Similar and/or corresponding elements may be given the same reference numerals in multiple figures, and to the extent that detailed explanations are omitted, it may be assumed that these details are at least similar to the details of the similar/corresponding elements that have already been described.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

There are many different types of display devices that are suitable for displaying an image. Examples of display devices may include liquid crystal displays (LCDs), electrophoretic displays, organic light-emitting displays, inorganic light-emitting displays, field emission displays, surface-conduction electron-emitter displays, plasma displays, and cathode ray tube displays.

Although exemplary embodiments of the present disclosure are described herein in terms of their application to an organic light-emitting display device, it is to be understood that various types of display devices may be used.

Figure 2:
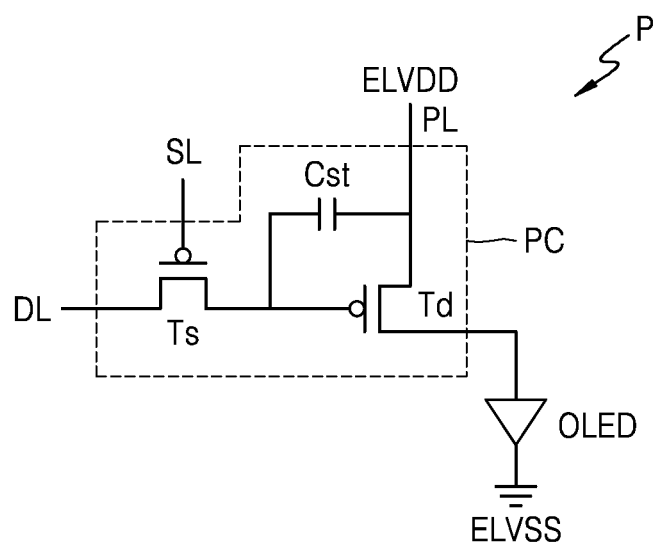
FIG. 2 is an equivalent circuit diagram illustrating a pixel of a display device according to an exemplary embodiment of the present disclosure.

FIG. 1 is a schematic plan view of a display device 1 according to an exemplary embodiment of the present disclosure. FIG. 2 is an equivalent circuit diagram of a pixel P of a display device 1 according to an exemplary embodiment of the present disclosure.

Referring to FIG. 1, the display device 1 includes a display unit 10 disposed on a substrate 100. The display unit 10 includes multiple pixels P that are each connected to a scan line SL extending in a y direction and a data line DL extending in an x direction intersecting with the y direction. The display unit 10 displays an image via light emitted from the pixels P. A region of the display unit 10 in which the pixels P are disposed is defined as a display area DA, and thus an image is capable of being displayed within the display area DA.

Each of the pixels P may emit, for example, one of a red light, green light, blue light, or white light. Each of the pixels P includes a display element, and the display element may include an organic light-emitting diode. Thus, the display area DA may include a first set of pixels that emit red light, a second set of pixels that emit green light, a third set of pixels that emit blue light, and optionally, a fourth set of pixels that emit white light. These various types of pixels may be interspersed in a desired pattern so as to be able to display any desired color near any particular region of the display area DA. In this manner, a desired image may be displayed within the display area DA.

Referring to FIG. 2, each pixel P may include a pixel circuit PC, connected to the scan line SL and the data line DL of that pixel P, and an organic light-emitting diode OLED connected to the pixel circuit PC. The pixel circuit PC includes a driving thin film transistor (TFT) Td, a switching TFT Ts, and a storage capacitor Cst. The switching TFT Ts is connected to the scan line SL and the data line DL, and is configured to transmit, to the driving TFT Td, a data signal received via the data line DL according to a scan signal received via the scan line SL.

The storage capacitor Cst is connected to the switching TFT Ts and a driving voltage line PL, and is configured to store a voltage corresponding to a difference between a voltage received from the switching TFT Ts and a driving voltage ELVDD supplied to the driving voltage line PL.

The driving TFT Td is connected to the driving voltage line PL and the storage capacitor Cst, and may be used to control a driving current flowing from the driving voltage line PL to the organic light-emitting diode OLED, in accordance with a voltage value stored in the storage capacitor Cst. The organic light-emitting diode OLED may emit light having a desired brightness by the driving current. The organic light-emitting diode OLED may emit, for example, red light, green light, blue light, or white light.

Although a case where the pixel P includes two TFTs and one storage capacitor is illustrated in FIG. 2, exemplary embodiments of the present disclosure may utilize a different arrangement of transistors and capacitors. According to an exemplary embodiment of the present disclosure, the pixel circuit PC of the pixel P may include three or more TFTs or two or more storage capacitors. In this way, various modifications may be made to the described arrangement while keeping within the spirit and scope of the present disclosure.

Referring back to FIG. 1, a peripheral area PA is arranged outside the display area DA. For example, the peripheral area PA may surround the display area DA. The peripheral area PA is an area where no pixels P are arranged, and the peripheral area PA corresponds to a non-display area where no images are provided.

On the peripheral area PA, a driving circuit, for example, first and second scan driving circuits 20 and 30, a terminal unit 40, a driving power supply line 60, and a common power supply line 70 may be arranged.

The first and second scan driving circuits 20 and 30 are arranged on the peripheral area PA of the substrate 100, and these first and second scan driving circuits 20 and 30 may be configured to generate and transmit a scan signal to each of the pixels P via the scan line SL. For example, the first scan driving circuit 20 may be disposed on the left side of the display unit 10 and the second scan driving circuit 30 may be disposed on the right side of the display unit 10. However, other arrangements of the pixel P and first and second scan driving circuits 20 and 30 may be provided.

The terminal unit 40 is disposed on one side of the substrate 100 and includes a plurality of terminals 41, 42, 44, and 45. The terminal unit 40 may be exposed, i.e., might not be covered with an insulating layer, and thus may be electrically connected to a flexible printed circuit board FPCB. The terminal unit 40 may be disposed on one side of the substrate 100 where the first and second scan driving circuits 20 and 30 are not located.

The flexible printed circuit board FPCB electrically connects a controller 90 to the terminal unit 40, and a signal or power received from the controller 90 travels along connection lines 21, 31, 51, 61, and 71 from the terminal unit 40.

The controller 90 may receive a vertical synchronization signal, a horizontal synchronization signal, and a clock signal and may generate a control signal for controlling the driving of the first and second scan driving circuits 20 and 30. The generated control signal may be transmitted to each of the first and second scan driving circuits 20 and 30 via the terminal 44 connected with the flexible printed circuit board FPCB and the connection lines 21 and 31. The scan signal of the first and second scan driving circuits 20 and 30 may be provided to each of the pixels P via the scan line SL. The controller 90 provides driving voltage (driving power)

ELVDD (referring to FIG. 2) and common voltage (common power) ELVSS (referring to FIG. 2) to the driving power supply line 60 and the common power supply line 70, respectively, via the terminals 42 and 45 connected to the flexible printed circuit board FPCB and the connection lines 61 and 71. The driving power ELVDD may be provided to each of the pixels P via the driving voltage line PL, and the common power ELVSS may be provided to a common electrode of each of the pixels P.

A data driving circuit 50 may be disposed on the flexible printed circuit board FPCB. The data driving circuit 50 provides a data signal to each of the pixels P. The data signal of the data driving circuit 50 is provided to each of the pixels P via the connection line 51 connected to the terminal 41 and the data line DL connected to the connection line 51. Although the data driving circuit 50 is disposed on the flexible printed circuit board FPCB in FIG. 1, exemplary embodiments of the present disclosure may utilize another configuration of the data driving circuit. For example, the data driving circuit 50 may be disposed on the peripheral area PA of the substrate 100.

The driving power supply line 60 may be disposed on the peripheral area PA. For example, the driving power supply line 60 may be disposed between one side of the display unit 10, that is adjacent to the terminal unit 40, and the terminal unit 40. The driving power ELVDD is provided via the connection line 61 and terminal 42 to the driving power supply line 60, and may be provided to each of the pixels P via the driving voltage line PL.

The common power supply line 70 may be disposed on the peripheral area PA, and may at least partially surround the display unit 10. For example, the common power supply line 70 has an open loop shape in which the side of the display unit 10 adjacent to the terminal unit 40 is open. The common power supply line 70 may extend along edges of the substrate 100 except for the edge that includes the terminal unit 40.

The common power supply line 70 is electrically connected to the terminal 45 via the connection line 71, and the common power supply line 70 provides the common power ELVSS to a common electrode (for example, a cathode) of the organic light-emitting diode OLED of the pixel P. In FIG. 1, the connection line 71 is shown as having an open loop shape in which one side partially surrounding the display unit 10 is open, and the connection line 71 overlaps the common power supply line 70. The connection line 71 partially surrounds the display unit 10, similar to the common power supply line 70. The connection line 71 may extend further toward one edge of the substrate 100 (e.g. the terminal unit 40) than the common power supply line 70 does.

On the substrate 100 including the aforementioned structure, an encapsulation substrate 300 is disposed to face the substrate 100. A sealing material 400 is disposed between the substrate 100 and the encapsulation substrate 300. The sealing material 400 may at least partially surround the display unit 10. In some implementations, the sealing material 400 may entirely surround the display unit 10, as viewed from a plan view as shown in FIG. 1. A space defined by the substrate 100, the encapsulation substrate 300, and the sealing material 400 may be spatially separated from the outside and thus may prevent infiltration of external moisture or impurities. In FIG. 1, the sealing material 400 is shown as entirely surrounding the display unit 10 and the first and second scan driving circuits 20 and 30. This may be understood as the display unit 10 and the first and second scan driving circuits 20 and 30 being arranged in a space (internal space) defined by the substrate 100, the encapsulation substrate 300, and the sealing material 400.

The sealing material 400 may include, for example, an inorganic material, such as frit, but exemplary embodiments of the present disclosure may utilize other types of sealing materials. For example, according to an exemplary embodiment of the present disclosure, the sealing material 400 may include an epoxy or the like.

Figure 3:
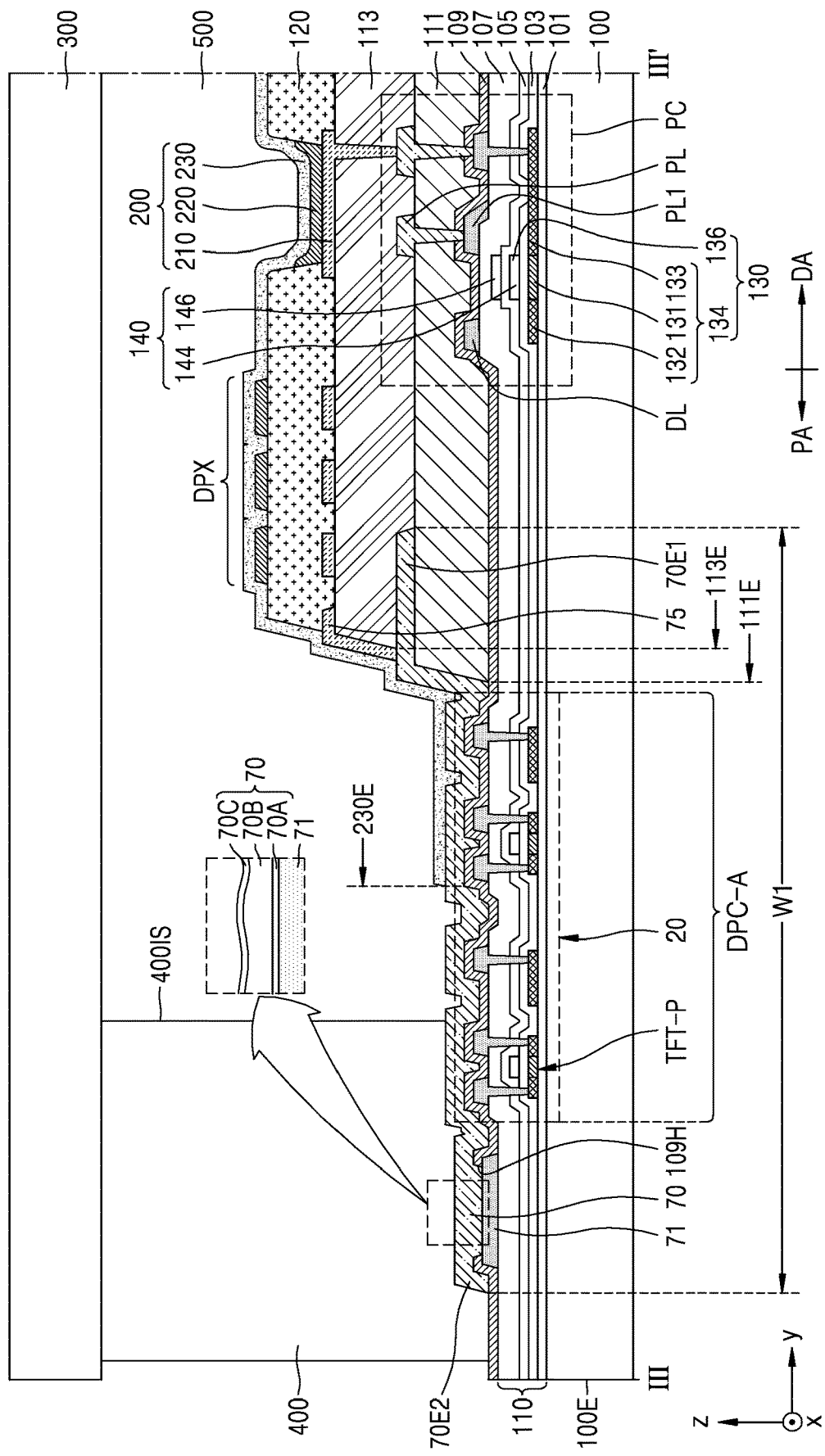
FIG. 3 is a cross-sectional view illustrating a display device according to an exemplary embodiment of the present disclosure.

FIG. 3 is a cross-sectional view of a portion of a display device according to an exemplary embodiment of the present disclosure, and the cross-section shown may correspond to a cross-section taken along line III-III' of FIG. 1.

Referring to FIG. 3, the display device includes the display area DA and the peripheral area PA. Both the substrate 100 and the encapsulation substrate 300 may include areas corresponding to the display area DA and the peripheral area PA. The substrate 100 may be formed of any of various materials, for example, glass, metal, or plastic such as polyethylene terephthalate (PET), polyethylene naphthalate (PEN), or polyimide (PI). The encapsulation substrate 300 may be substantially transparent and may include a transparent material. For example, the encapsulation substrate 300 may be formed of any of various materials, for example, glass, or plastic such as PET, PEN, or PI. The substrate 100 and the encapsulation substrate 300 may include the same material or different materials.

Referring to the display area DA of FIG. 3, a buffer layer 101 may be formed on the substrate 100. The buffer layer 101 may block foreign matter or moisture from entering via the substrate 100. For example, the buffer layer 101 may include an inorganic material, such as silicon oxide (SiOx), silicon nitride (SiNx), and/or silicon oxynitride (SiON), and may be formed as a multi-layer or a single layer.

A TFT 130, a storage capacitor 140 and an organic light-emitting diode, as a display element 200, is located at a location corresponding to the display area DA. The organic light-emitting diode is electrically connected to the TFT 130 and the storage capacitor 140. The TFT 130 of FIG. 3 may correspond to one of the TFTs included in the pixel circuit PC described above with reference to FIG. 2, for example, the driving TFT Td. The storage capacitor 140 of FIG. 3 may correspond to the storage capacitor Cst described above with reference to FIG. 2.

The TFT 130 includes a semiconductor layer 134 and a gate electrode 136. The semiconductor layer 134 may include, for example, polysilicon. The semiconductor layer 134 may include a channel region 131 that is overlapped by the gate electrode 136, and a source region 132 and a drain region 133 disposed on both sides of the channel region 131, respectively. The source region 132 and the drain region 133 may each include a higher concentration of impurities than the channel region 131. The impurities may include N-type impurities or P-type impurities. The source region 132 and the drain region 133 may be understood as a source electrode and a drain electrode of the TFT 130.

According to an exemplary embodiment of the present disclosure, the semiconductor layer 134 contains polysilicon. However, exemplary embodiments of the present disclosure are not limited to this particular composition of the semiconductor layer 134. For example, the semiconductor layer 134 may include amorphous silicon or an organic semiconductor material. According to an exemplary embodiment of the present disclosure, the semiconductor layer 134 may include an oxide semiconductor. The pixel circuit PC may include the driving TFT Td and the switching TFT Ts described above with reference to FIG. 2, and a semiconductor layer of the driving TFT Td and a semiconductor layer of the switching TFT Ts may include different materials. For example, one of the semiconductor layer of the driving TFT Td and the semiconductor layer of the switching TFT Ts may include an oxide semiconductor, and the other may include polysilicon.

A gate insulating layer 103 may be disposed between the semiconductor layer 134 and the gate electrode 136. The gate insulating layer 103 may be an inorganic insulating layer including silicon oxynitride (SiON), silicon oxide (SiOx), and/or silicon nitride (SiNx). The inorganic insulating layer may be formed as a multi-layer or as a single layer.

The storage capacitor 140 includes a first storage capacitor plate 144 and a second storage capacitor plate 146 that overlap each other. A first interlayer insulating layer 105 may be disposed between the first and second storage capacitor plates 144 and 146. The first interlayer insulating layer 105 has a certain permittivity, and may be an inorganic insulating layer including silicon oxynitride (SiON), silicon oxide (SiOx), and/or silicon nitride (SiNx), and may be formed as a multi-layer or a single layer. In FIG. 3, the storage capacitor 140 overlaps the TFT 130, and the first storage capacitor plate 144 is the gate electrode 136 of the TFT 130. However, exemplary embodiments of the present disclosure may have other arrangements. For example, the storage capacitor 140 might not overlap the TFT 130, and the first storage capacitor plate 144 may be a component independent from the gate electrode 136 of the TFT 130.

The storage capacitor 140 may be covered with a second interlayer insulating layer 107. The second interlayer insulating layer 107 may be an inorganic insulating layer including silicon oxynitride (SiON), silicon oxide (SiOx), and/or silicon nitride (SiNx). The second interlayer insulating layer 107 may be formed as a multi-layer or a single layer.

A driving voltage line PL may be disposed on a first organic insulating layer 111. The driving voltage line PL may include aluminum (Al), copper (Cu), and/or titanium (Ti), and may be formed as a single layer or as a multi-layer. According to an exemplary embodiment of the present disclosure, the driving voltage line PL may have a multi-layer structure of Ti/Al/Ti.

FIG. 3 shows a lower driving voltage line PL1 disposed below the first organic insulating layer 111. The lower driving voltage line PL1 may be electrically connected to the driving voltage line PL via a contact hole that penetrates through the first organic insulating layer 111, and may prevent a voltage drop of the driving voltage ELVDD provided via the driving voltage line PL. The lower driving voltage line PL1 may include a material that is the same as that included in the data line DL. For example, the lower driving voltage line PL1 and the data line DL may include Al, Cu, and/or Ti, and may be formed as a single layer or as a multi-layer. According to an exemplary embodiment of the present disclosure, the lower driving voltage line PL1 and the data line DL may have a multi-layer structure, such as Ti/Al/Ti or TiN/Al/Ti.

The first organic insulating layer 111 includes an organic insulating material. The organic insulating material may include an imide-based polymer, a general polymer such as polymethyl methacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, a blend thereof, and/or the like. According to an exemplary embodiment of the present disclosure, the first organic insulating layer 111 may include polymide.

The driving voltage line PL may be covered with a second organic insulating layer 113. The second organic insulating layer 113 may include a general polymer such as PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. According to an exemplar embodiment of the present disclosure, the second organic insulating layer 113 may include polymide.

A pixel electrode 210 is disposed on the second organic insulating layer 113. A pixel defining layer 120 may be disposed on the pixel electrode 210. The pixel defining layer 120 may define pixels by including respective openings corresponding to sub-pixels, namely, an opening via which at least a center portion of the pixel electrode 210 is exposed. The pixel defining layer 120 may prevent electrical arcing, or the like, from occurring between an edge of the pixel electrode 210 and a common electrode 230 of the display element 200, by increasing a distance between the edge of the pixel electrode 210 and the common electrode 230. The pixel defining layer 120 may be formed of an organic material, for example, polyimide or hexamethyldisiloxane (HMDSO).

An intermediate layer 220 may include a low-molecular weight or high-molecular weight material. When the intermediate layer 220 includes a low-molecular weight material, the intermediate layer 220 may have a structure in which a hole injection layer (HIL), a hole transport layer (HTL), an emission layer (EML), an electron transport layer (ETL), and an electron injection layer (EIL) are stacked in a single or complex structure, and may include various organic materials including copper phthalocyanine (CuPc), N,N'-Di (naphthalene-1-yl)-N,N'-diphenyl-benzidine (NPB), and tris-8-hydroxyquinoline aluminum (Alq3). These layers may be formed via vacuum deposition.

When the intermediate layer 220 includes a high-molecular material, the intermediate layer 220 may additionally include an HTL and an EML. In this case, the HTL may include poly(ethylenedioxythiophene) (PEDOT), and the EML may include a high-molecular weight material such as a polyphenylenevinylene (PPV)-based material or a polyfluorene-based material. The intermediate layer 220 is not limited to the above-described structure, and may have any of various other structures. For example, at least one of the layers that constitute the intermediate layer 220 may extend over a plurality of pixel electrodes 210. Alternatively, the intermediate layer 220 may include a layer patterned to correspond to each of the plurality of pixel electrodes 210.

The common electrode 230 may be disposed on the display area DA and may cover the display area DA. For example, the common electrode 230 may be formed as a single body such as to cover a plurality of pixels.

A filling material 500 may be disposed between the common electrode 230 and the encapsulation substrate 300. For example, the filling material 500 may include a photo-curable epoxy-based material and/or an acrylate-based material, but other arrangements may alternatively be used.

Referring to the peripheral area PA of FIG. 3, a driving circuit, for example, the first scan driving circuit 20, is disposed on the substrate 100. The first scan driving circuit 20 may include thin film transistors TFT-P, and may include a line connected with the thin film transistors TFT-P. The thin film transistors TFT-P may be formed together with the TFTs of the pixel circuit PC as part of the same process step. The first scan driving circuit 20 includes an insulating layer interposed between components (for example, interposed between a semiconductor layer and a gate electrode) of the thin film transistor TFT-P. For example, at least one of the buffer layer 101, the gate insulating layer 103, and the first and second interlayer insulating layers 105 and 107 may extend to the peripheral area PA to thereby form an insulating layer 110. The insulating layer 110 includes an inorganic insulating material. An inorganic insulating layer 109 may be disposed on the first scan driving circuit 20.

The first scan driving circuit 20 may be covered with the inorganic insulating layer 109. The inorganic insulating layer 109 may prevent exposure, to an etching environment, of a connection line 71 including metal that may be damaged by an etchant, like aluminum, during the manufacture of the display device. In FIG. 3, the inorganic insulating layer 109 is also disposed on the display area DA.

The inorganic insulating layer 109 may include an inorganic material, such as silicon oxide (SiOx), silicon nitride (SiNx), and/or silicon oxynitride (SiON), and may be formed as a multi-layer or a single layer. According to an exemplary embodiment of the present disclosure, the inorganic insulating layer 109 may include SiNx. The inorganic insulating layer 109 may have a thickness of at least about 500 Å. According to an exemplary embodiment of the present disclosure, a thickness of the inorganic insulating layer 109 may be equal to or greater than 1,000 Å, may be equal to or greater than 1,500 Å, may be equal to or greater than 2,000 Å, may be equal to or greater than 2,500 Å, may be equal to or greater than 3,000 Å, may be equal to or greater than 3,500 Å, may be equal to or greater than 4,000 Å, may be equal to or greater than 4,500 Å, may be equal to or greater than 5,000 Å, may be equal to or greater than 5,500 Å, may be equal to or greater than 6,000 Å, or may be equal to or greater than 6,500 Å. Alternatively, the inorganic insulating layer 109 may have a thickness of about 7,000 Å to about 10,000 Å.

The common power supply line 70 overlaps the first scan driving circuit 20 with the inorganic insulating layer 109 interposed therebetween. The common power supply line 70 may include a material that is the same as that included in the driving voltage line PL. The first scan driving circuit 20 is entirely covered with the common power supply line 70 and thus may be prevented from being damaged by static electricity.

A layer consisting of an inorganic insulating material, such as the inorganic insulating layer 109, is interposed between the first scan driving circuit 20 and the common power supply line 70. As a comparative example of the present disclosure, when an organic insulating layer is interposed between the first scan driving circuit 20 and the common power supply line 70, the common power supply line 70 includes through holes such that gases remaining in the organic insulating layer may be discharged therethrough. However, because only an inorganic insulating layer is interposed between the first scan driving circuit 20 and the common power supply line 70, as according to an exemplary embodiment of the present disclosure, inclusion of the above-described through holes configured to discharge a remaining gas is not necessary, and damage to the first scan driving circuit 20 by static electricity passing through the above-described through holes may be more effectively prevented.

A first width W1 of the common power supply line 70 may be greater than a width of the first scan driving circuit 20 or a width of a driving circuit area DPC-A on which the first scan driving circuit 20 is disposed.

The common power supply line 70 may have a first end 70E1, that is closes to the TFT 130, and a second end 70E2, that is farthest from the TFT 130, as seen in the cross-sectional view. The first end 70E1 of the common power supply line 70 may extend beyond the driving circuit area DPC-A toward a display unit (display region DA). The second end 70E2 of the common power supply line 70, which is opposite to the first end 70E1 in a width direction, may extend beyond the driving circuit area DPC-A toward an edge 100E of the substrate 100.

The first organic insulating layer 111 is interposed between the first end 70E1 of the common power supply line 70 and the inorganic insulating layer 109, in a z direction. If the first organic insulating layer 111 extends to cover the driving circuit area DPC-A, a through hole configured to discharge gas remaining in the first organic insulating layer 111 needs to be formed in the common power supply line 70, and this may lead to the first organic insulating layer 111 being damaged during the formation of the sealing material 400, or another related problem. Thus, the first organic insulating layer 111 is patterned to expose (i.e. not cover) the driving circuit area DPC-A. Accordingly, an end 111E of the first organic insulating layer 111 may be located between the first scan driving circuit 20 and the display area DA and/or between the driving circuit area DPC-A and the display area DA.

The first end 70E1 of the common power supply line 70 may be covered with the second organic insulating layer 113. Therefore, a problem may occur when the first end 70E1 of the common power supply line 70 is exposed without being covered with the second organic insulating layer 113. For example, during etching of the pixel electrode 210, the first end 70E1 of the common power supply line 70 may be damaged, or unwanted particles may be formed due to extraction of a material included in the common power supply line 70.

The second organic insulating layer 113 is also patterned to expose (i.e. not cover) the driving circuit area DPC-A and/or the first scan driving circuit 20. An end 113E of the second organic insulating layer 113 may be located between the first scan driving circuit 20 and the display area DA and/or between the driving circuit area DPC-A and the display area DA. In FIG. 3, the end 111E of the first organic insulating layer 111 extends further toward the edge 100E of the substrate 100 than the end 113E of the second organic insulating layer 113 does.

The end 113E of the second organic insulating layer 113 may be covered with a conductive layer 75 including a material that is the same as that included in the pixel electrode 210. In FIG. 3, the conductive layer 75 covers a lateral surface of the end 113E of the second organic insulating layer 113 and contacts an upper surface of the common power supply line 70 disposed below the end 113E of the second organic insulating layer 113. According to some exemplary embodiments of the present disclosure, the conductive layer 75 may include a through hole configured to discharge gas remaining in the second organic insulating layer 113. For example, a portion of the conductive layer 75 that contacts the second organic insulating layer 113 may include a through hole configured to discharge gas remaining in the second organic insulating layer 113.

The common power supply line 70 at least partially covers the connection line 71 located between the edge 100E of the substrate 100 and the first scan driving circuit 20 and/or the driving circuit area DPC-A. In some implementations, the common power supply line 70 entirely covers the connection line 71 as shown in FIG. 3. In some implementations, the second end 70E2 of common power supply line 70 may extends to the edge 100E of the substrate 100 beyond the connection line 71. The connection line 71 and the common power supply line 70 may be electrically connected to each other and may contact each other through a contact hole 109H of the inorganic insulating layer 109.

The sealing material 400 is disposed on the common power supply line 70, and may overlap the second end 70E2 of the common power supply line 70 and the first scan driving circuit 20. The sealing material 400 may include frit, epoxy, or the like, as described above. The frit may be a paste including a laser or infrared absorbing material, an organic binder, and/or a filler for reducing a thermal expansion coefficient, and the like, that is disposed within a main material, such as $SiO_2$. The frit paste may be hardened by removing the organic binder and moisture via a drying or firing process. The laser or infrared absorbing material may include a transition metal compound. After drying or firing, laser light may be used as a heat source for hardening the sealing material 400. The laser light may reach the second end 70E2 of the common power supply line 70 that overlaps the sealing material 400. As a result of the application of the laser light, an upper surface of at least one of first through third metal layers 70A, 70B, and 70C that constitute the second end 70E2 of the common power supply line 70 may become an irregular surface, as shown in a magnified view of FIG. 3. The magnified view of FIG. 3 shows that the first through third metal layers 70A, 70B, and 70C of the common power supply line 70 have a three-layered structure of Ti/Al/Ti or TiN/Al/Ti.

The common power supply line 70 is electrically connected to the common electrode 230 of the display element 200. An end 230E of the common electrode 230 may extend over/onto the first scan driving circuit 20 beyond a dummy pixel region DPX of the peripheral area PA and may directly contact the common power supply line 70. The end 230E of the common electrode 230 may be disposed a certain distance away from an inner sidewall 400IS of the sealing material 400.

Because the common power supply line 70 has the first width W1 and entirely covers the first scan driving circuit 20, damage to the first scan driving circuit 20 by static electricity may be prevented, a voltage drop of the common voltage ELVSS (see FIG. 2) applied to the common electrode 230 may be prevented due to prevention of a resistance increase of the common power supply line 70, and power consumption of the display device may be reduced.

Because the common power supply line 70 has the first width W1 and entirely covers the first scan driving circuit 20, the width of a portion of the connection line 71 between the edge 100E of the substrate 100 and the first scan driving circuit 20 may be reduced without the voltage drop of the common voltage ELVSS (see FIG. 2) applied to the common electrode 230, and accordingly, the width of the peripheral area PA of the display device may be reduced.

Figure 4:
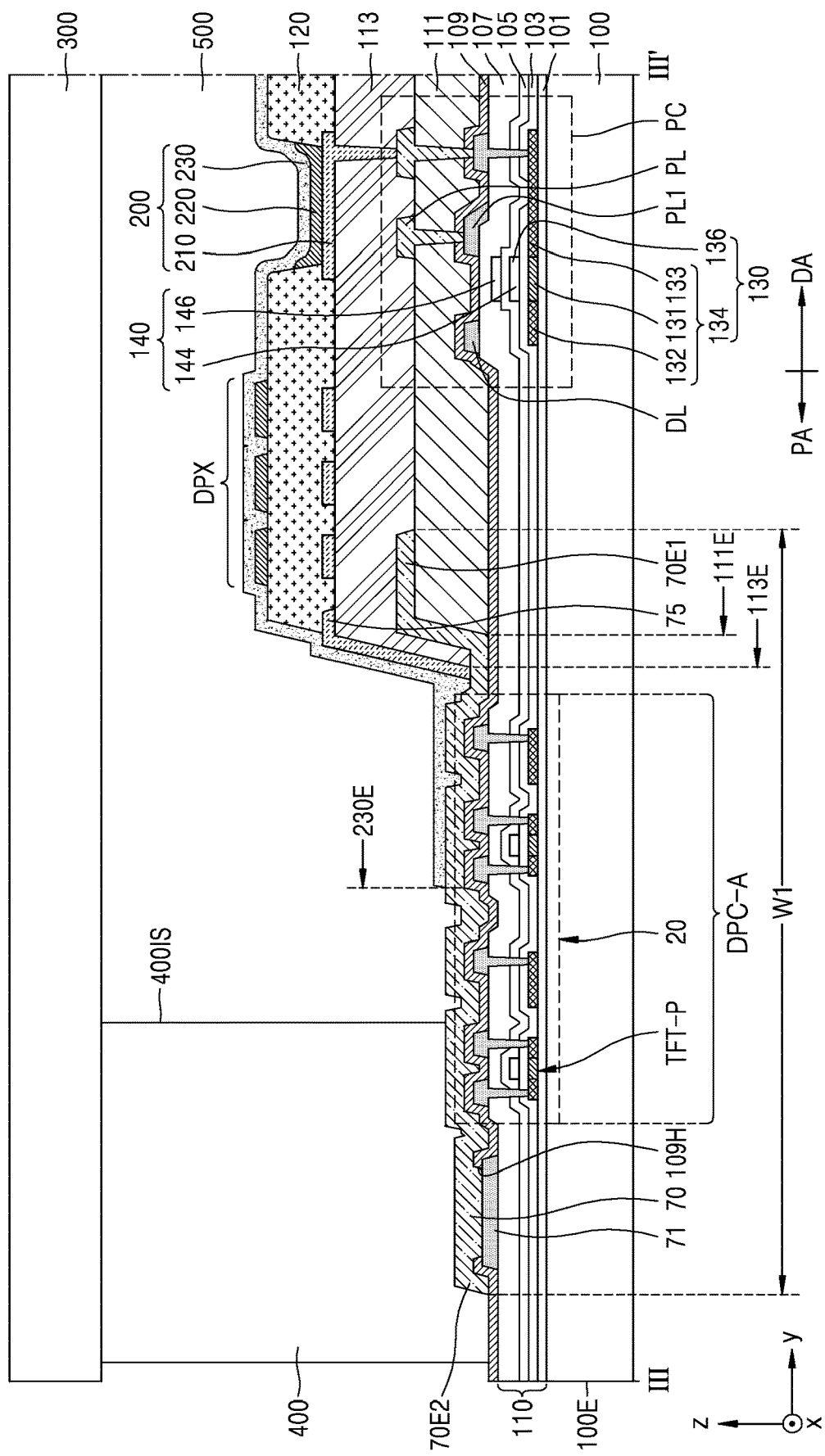
FIG. 4 is a cross-sectional view illustrating a display device according to an exemplary embodiment of the present disclosure.

FIG. 4 is a cross-sectional view of a display device according to an exemplary embodiment of the present disclosure, and may correspond to a cross-section taken along line III-III' of FIG. 1. All components of the display device of FIG. 4 except for the ends 111E and 113E of the first and second organic insulating layers 111 and 113, the conductive layer 75, and components related therewith may be considered to be at least similar to those corresponding elements described above with reference to FIG. 3, and thus differences between FIGS. 3 and 4 will now be focused on and described.

Each of the ends 111E and 113E of the first and second organic insulating layers 111 and 113 is disposed between the first scan driving circuit 20 and the display area DA and/or between the driving circuit area DPC-A and the display area DA.

The end 113E of the second organic insulating layer 113 may extend further toward the first scan driving circuit 20 and/or the driving circuit area DPC-A than the end 111E of the first organic insulating layer 111 does, but the end 113E of the second organic insulating layer 113 does not cover the first scan driving circuit 20. The end 113E of the second organic insulating layer 113 may be covered with the conductive layer 75. For example, the conductive layer 75 may cover the lateral surface of the end 113E of the second organic insulating layer 113 and at the same time may contact the upper surface of the common power supply line 70 disposed below the end 113E of the second organic insulating layer 113. According to some exemplary embodiments of the present disclosure, a portion of the conductive layer 75 that contacts the second organic insulating layer 113 may include a through hole configured to discharge gas remaining in the second organic insulating layer 113.

Figure 5:
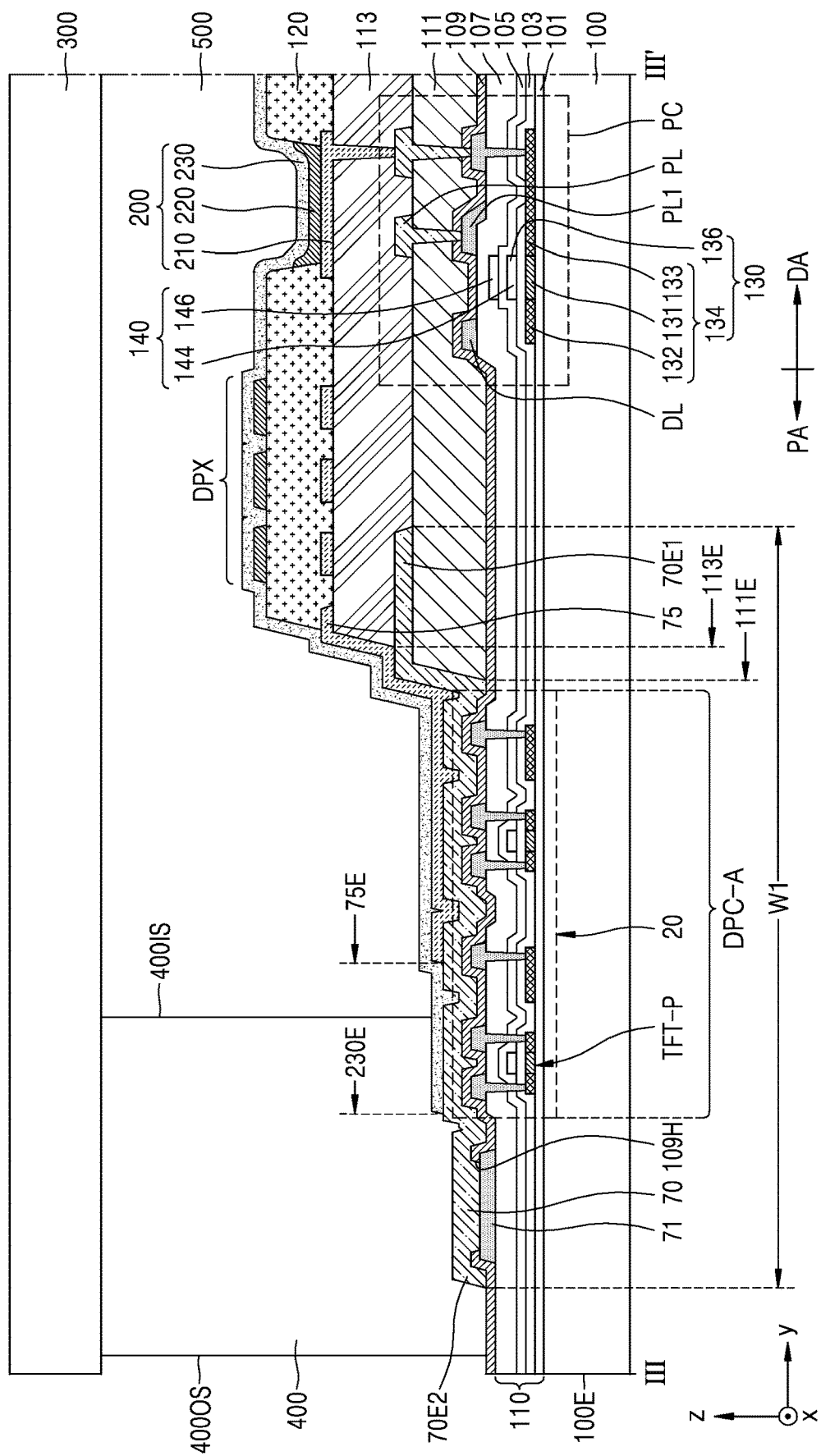
FIG. 5 is a cross-sectional view illustrating a display device according to an exemplary embodiment of the present disclosure.

FIG. 5 is a cross-sectional view of a display device according to an exemplary embodiment of the present disclosure, and may correspond to a cross-section taken along line III-III' of FIG. 1. All components of the display device of FIG. 5 except for the common electrode 230, the conductive layer 75, and components related therewith may be at least similar to those corresponding elements described above with reference to FIG. 3, and thus differences between FIGS. 3 and 5 will now be focused on and described.

Referring to FIG. 5, the end 230E of the common electrode 230 may be overlapped by the sealing material 400. For example, the end 230E of the common electrode 230 may be disposed between the inner sidewall 400IS of the sealing material 400 and an outer sidewall 400OS thereof. The first scan driving circuit 20 may be effectively protected from static electricity, due to a multi-layered structure of the common power supply line 70 and the common electrode 230. In addition, because a contact surface between the common electrode 230 and the common power supply line 70 increases, a voltage drop of the common voltage ELVSS (see FIG. 2) applied to the common electrode 230 may be prevented, and power consumption of the display device may be reduced.

In FIG. 5, the common electrode 230 entirely covers the first scan driving circuit 20 and/or the driving circuit area DPC-A. According to an exemplary embodiment of the present disclosure, the common electrode 230 may be at least partially overlapped by the sealing material 400, but the common electrode 230 may cover only a portion of the first scan driving circuit 20 and/or the driving circuit area DPC-A.

The conductive layer 75 may cover a lateral surface of the end 113E of the second organic insulating layer 113 but may extend to the first scan driving circuit 20 and/or the driving circuit area DPC-A. The conductive layer 75 may at least partially cover a portion of the first scan driving circuit 20. The conductive layer 75 may directly contact the common power supply line 70. Because no insulating layers (e.g., no organic insulating layers) might be interposed between the conductive layer 75 and the common power supply line 70, a problem related to outgasing that may otherwise occur by an organic insulating layer is prevented. Accordingly, no through holes need be formed in a portion of the conductive layer 75 that overlaps the common power supply line 70.

In FIG. 5, an end 75E of the conductive layer 75 is disposed on the first scan driving circuit 20 and contacts the common power supply line 70, but is a certain distance away from the inner sidewall 400IS of the sealing material 400 and is located further toward the inside of the display device than the end 230E of the common electrode 230. According to an exemplary embodiment of the present disclosure, the end 75E of the conductive layer 75 may extend past the first scan driving circuit 20 and may be interposed between the inner sidewall 400IS and the outer sidewall 400OS of the sealing material 400, and may be overlapped by the sealing material 400.

The ends 111E and 113E of the first and second organic insulating layers 111 and 113 and the conductive layer 75 from among the components of the display device of FIG. 5 may have the same structures as those shown in FIG. 4.

Figure 6:
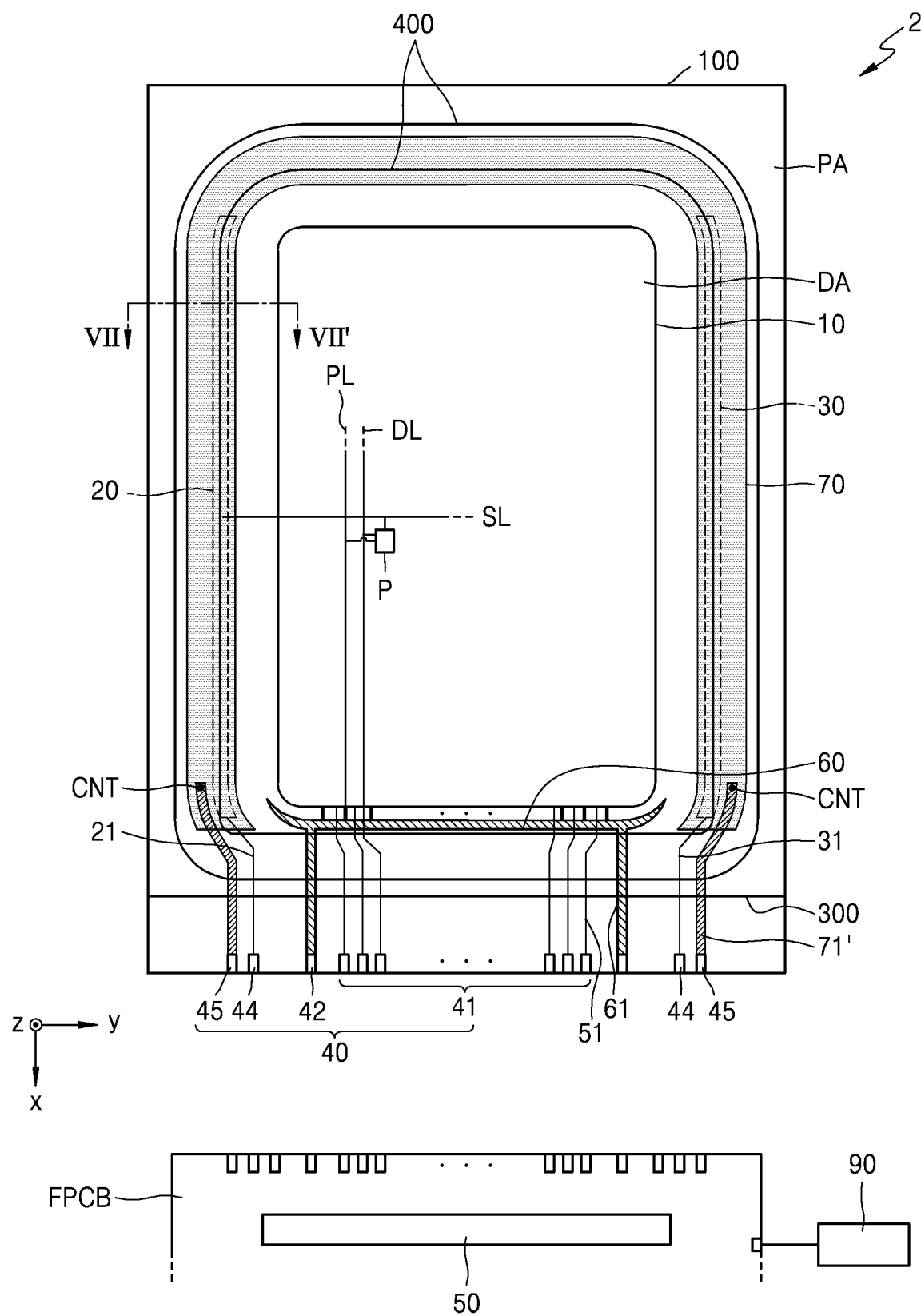
FIG. 6 is a schematic plan view illustrating a display device according to an exemplary embodiment of the present disclosure.

FIG. 6 is a plan view illustrating a display device 2 according to an exemplary embodiment of the present disclosure. The display device 2 of FIG. 6 is different from the display device 1 described above with reference to FIGS. 1 and 2 in terms of a connection line 71' and components related therewith. To the extent that the description of elements are not provided herein, it may be assumed that these elements are at least similar to corresponding elements that have already been described with respect to FIGS. 1 and 2.

Referring to FIG. 6, the connection line 71' connects the common power supply line 70 of the display device 2 with the terminal 45 of the terminal unit 40, and may be located between one side of the display unit 10 and the terminal unit 40. For example, the connection line 71' may be interposed between the terminal unit 40 and one side of the display unit 10 adjacent to the terminal unit 40. The connection line 71' may be electrically connected to the common power supply line 70 having an open loop shape in which one side partially surrounding the display unit 10 is open. The connection line 71' and the common power supply line 70 may be connected to each other via a contact hole CNT of an insulating layer, for example, an inorganic insulating layer, interposed therebetween. A contact area between the connection line 71' and the common power supply line 70, namely, the contact hole CNT, may be an area adjacent to one side of the display unit 10 that faces the terminal unit 40.

Because the connection line 71 of the display device 1 of FIG. 1 has an open loop shape, and may be connected to the common power supply line 70 while overlapping the common power supply line 70, a connection area between the connection line 71 and the common power supply line 70 has an open loop shape similar to that of the common power supply line 70. Thus, as viewed from the cross-sectional views of FIGS. 3 through 5, the connection line 71 overlaps with the common power supply line 70. However, a connection area between the connection line 71' and the common power supply line 70 of FIG. 6 may be limited to an area adjacent to one side of the display unit 10 that faces the terminal unit 40. Because the connection line 71' is not located around a driving circuit (for example, the first and second scan driving circuits 20 and 30) on the peripheral area PA of the display device 2, the peripheral area PA, for example, the peripheral area PA around the driving circuit, may have a reduced width.

Figure 7:
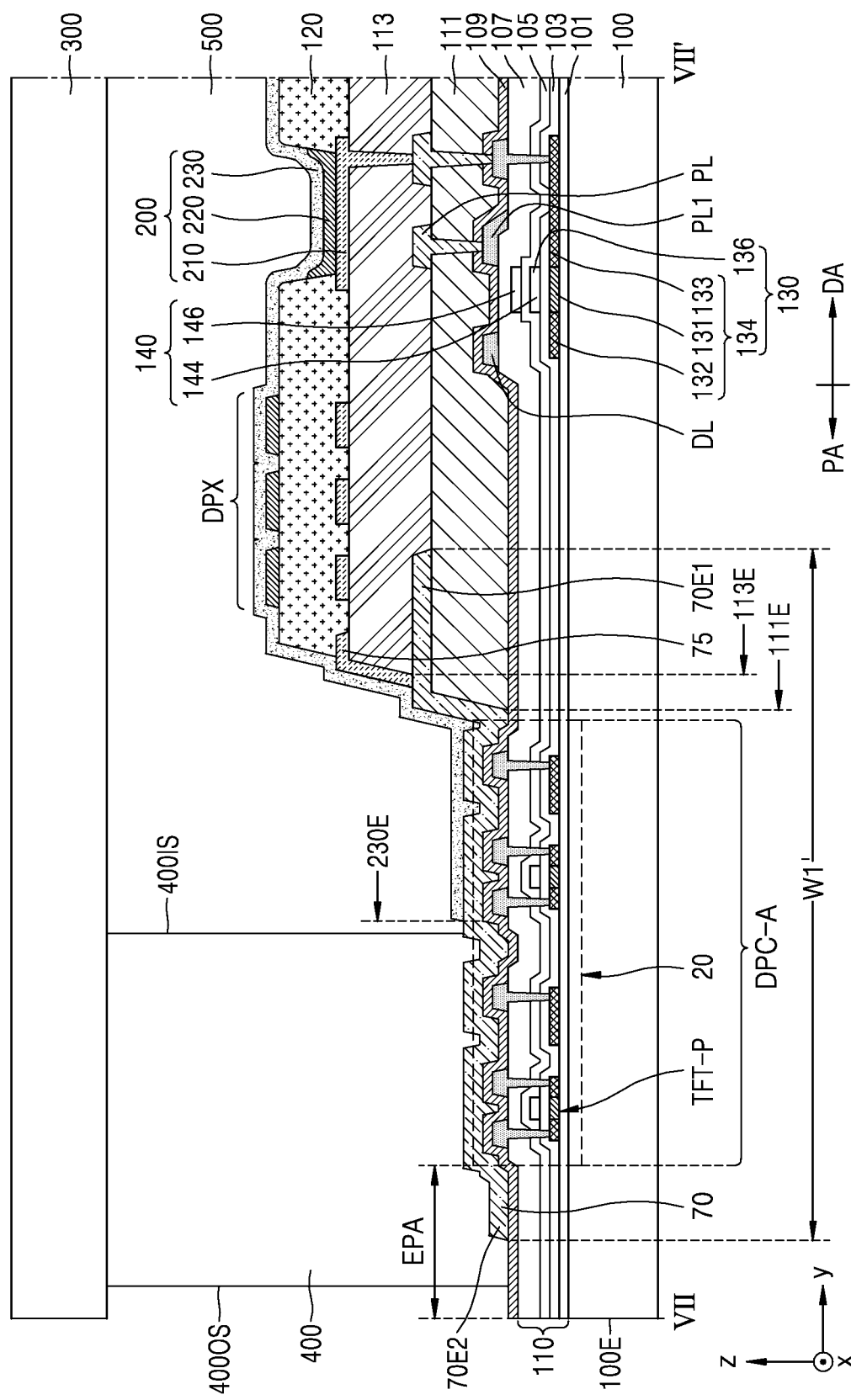
FIG. 7 is a cross-sectional view illustrating a display device according to an exemplary embodiment of the present disclosure.

FIG. 7 is a cross-sectional view of a display device according to an exemplary embodiment of the present invention, and FIG. 7 corresponds to a cross-section taken along line VII-VII' of FIG. 6.

Referring to FIG. 7, in contrast with FIGS. 3 through 5, no connection lines 71' are located on a peripheral area PA where a driving circuit, for example, the first scan driving circuit 20, is located. Because no connection lines 71' are arranged on the peripheral area PA around the first scan driving circuit 20 as described above with reference to FIG. 6, the peripheral area PA may have a more reduced width. Because the display area DA of FIG. 7 is the same as the display area DA described above with reference to FIG. 3, the peripheral area PA will now be focused on and described.

Referring to the peripheral area PA of FIG. 7, the driving circuit, for example, the first scan driving circuit 20, may be disposed on the substrate 100, and the first scan driving circuit 20 may include thin film transistors TFT-P and a line connected with the thin film transistors TFT-P. The thin film transistors TFT-P may be formed together with the TFTs of the pixel circuit PC as part of the same process step. The first scan driving circuit 20 includes an insulating layer(s) interposed between components (for example, a semiconductor layer and a gate electrode) of the thin film transistor TFT-P. At least one of the buffer layer 101, the gate insulating layer 103, and the first and second interlayer insulating layers 105 and 107 may extend to the peripheral area PA to thereby form an insulating layer 110. The insulating layer 110 is an inorganic insulating layer.

The first scan driving circuit 20 is covered with the inorganic insulating layer 109, and a thickness, a material, and the like of the inorganic insulating layer 109 are the same as those described above with reference to FIG. 3. In FIG. 7, the inorganic insulating layer 109 is also disposed on the display area DA.

The common power supply line 70 overlaps the first scan driving circuit 20. Only an insulating layer of an inorganic insulating material, such as the inorganic insulating layer 109, is interposed between the first scan driving circuit 20 and the common power supply line 70. The common power supply line 70 may include a material that is the same as that included in the driving voltage line PL. The first scan driving circuit 20, covered with the common power supply line 70, may be protected from static electricity. Because no organic insulating layers are interposed between the common power supply line 70 and the first scan driving circuit 20, discharge of remaining gas that occur when an organic insulating layer is interposed therebetween is prevented. Thus, as described above, no through holes are formed in the common power supply line 70, in more detail, in a portion of the common power supply line 70 that overlaps the first scan driving circuit 20 and the inorganic insulating layer 109.

A first width W1' of the common power supply line 70 may be greater than a width of the first scan driving circuit 20 or a width of a driving circuit area DPC-A on which the first scan driving circuit 20 is disposed. A first end 70E1 of the common power supply line 70 may extend beyond the driving circuit area DPC-A toward a display unit (display region DA), and a second end 70E2 of the common power supply line 70, which is an opposite to the first end 70E1, may extend beyond the driving circuit area DPC-A toward an edge 110E of the substrate 100.

The first end 70E1 of the common power supply line 70 is disposed on the first organic insulating layer 111 and is covered with the second organic insulating layer 113. The ends 111E and 113E of the first and second organic insulating layers 111 and 113 are certain distances away from the sealing material 400, respectively. The ends 111E and 113E of the first and second organic insulating layers 111 and 113 may be located in an inner side of the first scan driving circuit 20, namely, the driving circuit area DPC-A, such that they do not cover the first scan driving circuit 20. The end 113E of the second organic insulating layer 113 may be covered with a conductive layer 75 including a material that is the same as that included in the pixel electrode 210.

Similar to the description given above with reference to FIG. 3, the second end 70E2 of the common power supply line 70 extends further toward the edge 100E of the substrate 100 beyond the first scan driving circuit 20 and/or the driving circuit area DPC-A. For example, the second end 70E2 of the common power supply line 70 may be overlapped by the sealing material 400 and may be located between the inner sidewall 400IS and the outer sidewall 400OS of the sealing material 400.

As described above with reference to FIG. 6, because no connection lines 71' are located on a portion of the peripheral area PA around the first scan driving circuit 20, an area EPA between the first scan driving circuit 20 and the edge 100E of the substrate 100 or between the driving circuit area DPC-A and the edge 100E of the substrate 100 may have a smaller width than that described above with reference to FIG. 3.

The sealing material 400 is disposed on the common power supply line 70, and may at least partially overlap the common power supply line 70 and the first scan driving circuit 20. The sealing material 400 may include frit, epoxy, or the like, as described above.

The common power supply line 70 is electrically connected to the common electrode 230 of the display element 200. An end 230E of the common electrode 230 may extend over/onto the first scan driving circuit 20 beyond a dummy pixel region DPX of the peripheral area PA and may directly contact the common power supply line 70. The end 230E of the common electrode 230 may be a certain distance away from the inner sidewall 400IS of the sealing material 400.

Figure 8:
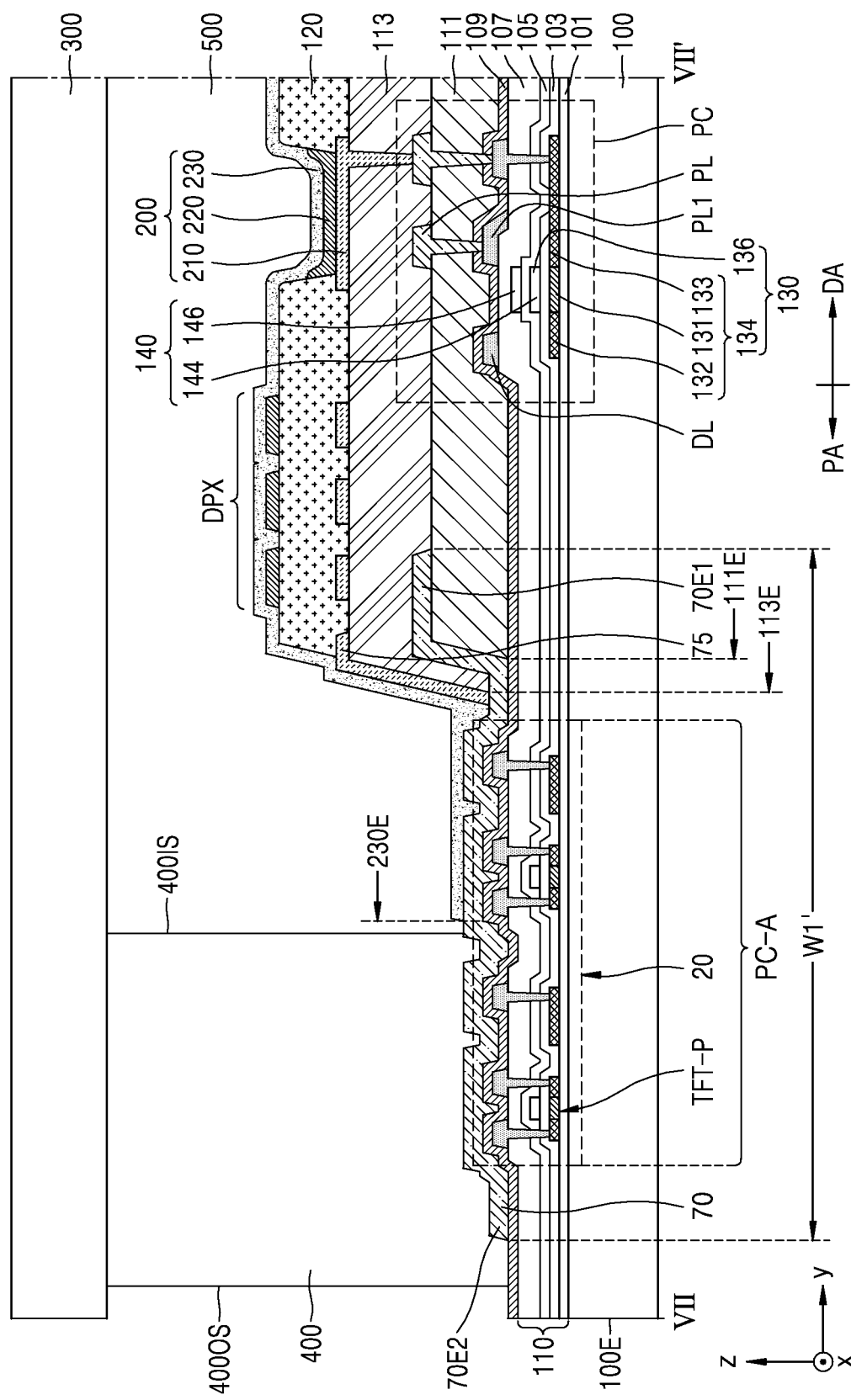
FIG. 8 is a cross-sectional view illustrating a display device according to an exemplary embodiment of the present disclosure.

FIG. 8 is a cross-sectional view of a display device according to an exemplary embodiment of the present disclosure, and may correspond to a cross-section taken along line VII-VII' of FIG. 6. All components of the display device of FIG. 8 except for the ends 111E and 113E of the first and second organic insulating layers 111 and 113, the conductive layer 75, and components related therewith are at least similar to those described above with reference to FIG. 7, and thus differences between FIGS. 7 and 8 will now be focused on and described.

Each of the ends 111E and 113E of the first and second organic insulating layers 111 and 113 is disposed between the first scan driving circuit 20 and the display area DA and/or between the driving circuit area DPC-A and the display area DA.

The end 113E of the second organic insulating layer 113 may extend further toward the first scan driving circuit 20 and/or the driving circuit area DPC-A than the end 111E of the first organic insulating layer 111 does, but the end 113E of the second organic insulating layer 113 does not cover the first scan driving circuit 20. The end 113E of the second organic insulating layer 113 may be covered with the conductive layer 75. The conductive layer 75 may cover the lateral surface of the end 113E of the second organic insulating layer 113 and at the same time may contact the upper surface of the common power supply line 70 disposed below the end 113E of the second organic insulating layer 113. According to some exemplary embodiments of the present disclosure, a portion of the conductive layer 75 that contacts the second organic insulating layer 113 may include a through hole configured to discharge gas remaining in the second organic insulating layer 113.

Figure 9:
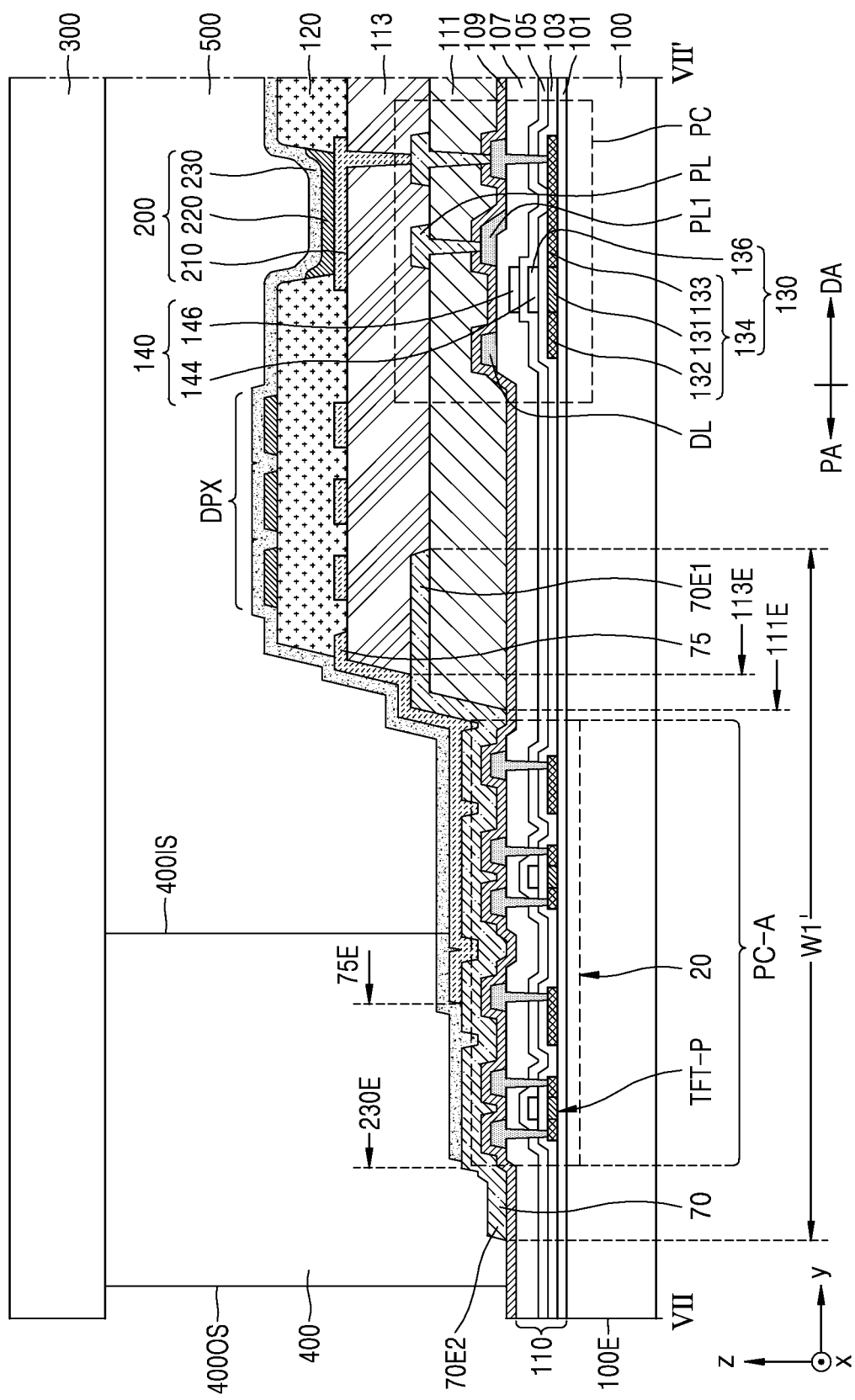
FIG. 9 is a cross-sectional view illustrating a display device according to an exemplary embodiment of the present disclosure.

FIG. 9 is a cross-sectional view of a display device according to an exemplary embodiment of the present disclosure, and may correspond to a cross-section taken along line VII-VII' of FIG. 6. All components of the display device of FIG. 9 except for the common electrode 230, the conductive layer 75, and components related therewith are at least similar to corresponding elements described above with reference to FIG. 7, and thus differences between FIGS. 7 and 9 will now be focused on and described.

Referring to FIG. 9, the end 230E of the common electrode 230 may be overlapped by the sealing material 400. For example, the end 230E of the common electrode 230 may be disposed between the inner sidewall 400IS of the sealing material 400 and the outer sidewall 400OS thereof. The first scan driving circuit 20 may be effectively protected from static electricity, due to a multi-layered structure of the common power supply line 70 and the common electrode 230. In addition, because a contact surface between the common electrode 230 and the common power supply line 70 increases, a voltage drop of the common voltage ELVSS (see FIG. 2) applied to the common electrode 230 may be prevented, and power consumption of the display device may be reduced.

Although the common electrode 230 entirely covers the first scan driving circuit 20 and/or the driving circuit area DPC-A in FIG. 9, other configurations may be used. According to an exemplary embodiment of the present disclosure, the common electrode 230 may be overlapped by the sealing material 400, and may cover only a portion of the first scan driving circuit 20 and/or the driving circuit area DPC-A.

The conductive layer 75 may cover a lateral surface of the end 113E of the second organic insulating layer 113 and may extend to the first scan driving circuit 20 and/or the driving circuit area DPC-A. The conductive layer 75 may cover at least a portion of the first scan driving circuit 20. The conductive layer 75 may directly contact the common power supply line 70. Because no insulating layers (e.g., no organic insulating layers) are interposed between the conductive layer 75 and the common power supply line 70, a problem related to outgasing that may occur by an organic insulating layer is prevented. Thus, a portion of the conductive layer 75 that overlaps the common power supply line 70 does not need to include a through hole or the like.

In FIG. 9, the end 75E of the conductive layer 75 is disposed on the first scan driving circuit 20 and contacts the common power supply line 70, and is located between the inner sidewall 400IS and the outer sidewall 400OS of the sealing material 400. According to an exemplary embodiment of the present disclosure, the end 75E of the conductive layer 75 may be located further toward the inside of the display device than the inner sidewall 400IS of the sealing material 400, and thus might not be overlapped by the sealing material 400.

The ends 111E and 113E of the first and second organic insulating layers 111 and 113 and the conductive layer 75 from among the components of the display device of FIG. 9 may have the same structures as those shown in FIG. 8.

Although cross-sections based on the first scan driving circuit 20 as a driving circuit have been described in FIGS. 3 through 5 and FIGS. 7 through 9, cross-sections based on the second scan driving circuit 30 as a driving circuit may also have the same structures as the above-described structures.

According to the above-described embodiments, the driving circuit is a scan driving circuit. However, according to an exemplary embodiment of the present disclosure, the driving circuit may be a data driving circuit or the like. When a data driving circuit is disposed on the peripheral area PA of the substrate 100, the data driving circuit may be disposed on an upper side of the substrate 100 that is opposite to a lower side of the substrate 100 where the terminal unit 40 is disposed, on the plan views of FIGS. 1 and 6. A structure of a cross-section of this case is substantially the same as that described above with reference to FIGS. 3 through 5 and FIGS. 7 through 9 except that the data driving circuit is disposed on the driving circuit area DPC-A.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device, comprising:
a substrate;
an encapsulation substrate on the substrate;
a sealing material interposed between the substrate and the encapsulation substrate;
a light-emitting diode in a display area of the substrate and comprising a first electrode, and a second electrode on the first electrode, and an intermediate layer between the first electrode and the second electrode;
an inorganic insulating layer on the substrate and being disposed under the sealing material;
a first organic insulating layer disposed on the inorganic insulating layer, the first organic insulating layer being interposed between the light-emitting diode and the inorganic insulating layer and not being disposed under the sealing material;
a power supply line on the inorganic insulating layer, the power supply line being in the peripheral area surrounding the display area; and
a conductive layer, wherein the power supply line, the conductive layer, and the second electrode of the light-emitting diode are electrically connected to each other;
wherein apart of the conductive layer overlaps the power supply line, and a part of the second electrode of the light-emitting diode overlaps the conductive layer,
wherein the sealing material comprises an inner surface facing the display area and an outer surface opposite to the inner surface, and a first distance from the outer surface of the sealing material to an edge of the power supply line is less than a second distance from the outer surface of the sealing material to an edge of the second electrode of the light-emitting diode, and
wherein the power supply line extends past the inner surface of the sealing material and is disposed above the first organic insulating layer such that the first organic insulating layer is disposed between the power supply line and the inorganic insulating layer.

2. The display device of claim 1, wherein the power supply line is overlapped by the seal material.

3. The display device of claim 2, wherein the second electrode of the light-emitting diode is overlapped by the seal material, and wherein an overlapping area between the power supply line and the seal material is greater than an overlapping area between the second electrode of the light-emitting diode and the seal material.

4. The display device of claim 2, further comprising a driving circuit in the peripheral area of the substrate, wherein the driving circuit is overlapped by the seal material, and
wherein an overlapping area between the power supply line and the seal material is greater than an overlapping area between the driving circuit and the seal material.

5. The display, device of claim 4, wherein the power supply line entirely covers the driving circuit.

6. The display device of claim 1, wherein a second edge of the power supply line which is opposite to the edge of the power supply line is on the first organic insulating layer.

7. The display device of claim 6, wherein a side surface of the first organic insulating layer is covered by the power supply line.

8. The display device of claim 6, further comprising a second organic insulating layer on between the first organic insulating layer and the light-emitting diode, the second edge of the power supply line is overlapped by the second organic insulating layer.

9. The display device of claim 1, wherein the second electrode of the light-emitting diode is in direct contact with the power supply line.

10. The display device of claim 1, wherein the power supply line has an open loop shape in which a region corresponding to one side of the display area is open.

11. The display device of claim 1, further comprising
a terminal unit disposed on one side of the substrate and electrically connected to a flexible printed circuit board; and
a connection line electrically connecting a terminal of the terminal unit to the power supply line.

12. The display device of claim 11, wherein the connection line is under the inorganic insulating layer, wherein the power supply line is electrically connected to the connection line via a contact hole defined in the inorganic insulating layer.

13. The display device of claim 1, wherein the power supply line has an irregular upper surface below the seal material.

14. The display device of claim 13, wherein the power supply line comprises a plurality of metal sub-layers.

* * * * *